United States Patent [19]

Janesick et al.

[11] Patent Number: 4,798,958
[45] Date of Patent: Jan. 17, 1989

[54] CCD IMAGING SENSORS

[75] Inventors: James R. Janesick, La Canada; Stythe T. Elliott, Sun Valley, both of Calif.

[73] Assignee: California Institute of Technology, Pasadena, Calif.

[21] Appl. No.: 31,198

[22] Filed: Mar. 27, 1987

Related U.S. Application Data

[63] Continuation of Ser. No. 642,417, Aug. 20, 1984, abandoned.

[51] Int. Cl.$^4$ .................. G01T 1/24; H01L 29/78; H01L 27/14; G11C 11/34
[52] U.S. Cl. .................. 250/370.01; 250/370.09; 357/24; 357/30; 357/55; 365/114
[58] Field of Search .......... 250/370 R, 370 K, 370 H, 250/370 G, 370 G X, 372, 578; 377/57–63, 24, 29, 30, 55; 365/103, 114

[56] References Cited

U.S. PATENT DOCUMENTS

| | | | |
|---|---|---|---|
| 3,654,499 | 4/1972 | Smith | 357/24 |
| 3,796,932 | 3/1974 | Amelio et al. | 357/24 |
| 4,040,092 | 8/1977 | Carnes | 250/578 |
| 4,184,896 | 1/1980 | Millea | 357/24 |
| 4,245,158 | 1/1981 | Burstein et al. | 250/370 |

OTHER PUBLICATIONS

Bhatia et al, "Irradiation Technique for Making Single Electrode Charge-Coupled Storage Cell", IBM Tech. Disclosure Bulletin, vol. 15 (8/72), pp. 723–724.

*Primary Examiner*—Gene M. Munson
*Attorney, Agent, or Firm*—Freilich, Hornbaker, Rosen & Fernandez

[57] ABSTRACT

A method for promoting quantum efficiency (QE) of a CCD imaging sensor for UV, far UV and low energy x-ray wavelengths by overthinning the back side beyond the interface between the substrate and the photosensitive semiconductor material, and flooding the back side with UV prior to using the sensor for imaging. This UV flooding promotes an accumulation layer of positive states in the oxide film over the thinned sensor to greatly increase QE for either frontside or backside illumination. A permanent or semipermanent image (analog information) may be stored in a frontside $SiO_2$ layer over the photosensitive semiconductor material using implanted ions for a permanent storage and intense photon radiation for a semipermanent storage. To read out this stored information, the gate potential of the CCD is biased more negative than that used for normal imaging, and excess charge current thus produced through the oxide is integrated in the pixel wells for subsequent readout by charge transfer from well to well in the usual manner.

11 Claims, 10 Drawing Sheets

FIG. II

CCD IMAGING SENSORS

ORIGIN OF INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

This is a continuation of application Ser. No. 642,417, filed 8/20/84, now abandoned.

FIELD OF THE INVENTION

This invention relates to charge-coupled devices (CCDs), and more particularly to improvements in the performance of thinned backside-illuminated sensors for blue, ultraviolet, far ultraviolet, and low energy x-ray wavelengths. A photon or ion implanted analog memory may be optionally provided without interfering with normal image sensing.

BACKGROUND OF THE INVENTION

Charge-coupled devices (CCDs) were first introduced by Bell Telephone Laboratories in 1970. The potential of these devices was quickly recognized, and used spanning almost all electronic fields were proposed. The ability to store charge led immediately to proposals of CCD memories and logic circuits. The ability to work in the charge domain has its advantages in the signal processing area. And, of course, the ability of silicon to detect visible radiation caused CCDs to be quickly developed as imaging sensors. Laboratory research now indicates that the CCD technology offers unprecedented capabilities in the area of radiation detection:

(1) Spectral response extends over a remarkable range of photon and particle energies. Devices exist that respond to photons throughout the entire spectral range of 1 to 10,000 Å and to electrons of energy greater than 1 keV.

(2) While noise performance varies dramatically among CCDs, levels as low as 7 $e^-$ (rms) per pixel have been realized in groundbased astronomical instruments and 4 $e^-$ (rms) per pixel in laboratory cameras. Such levels permit the detection and measurement of very faint incident radiation, particularly when coupled with the CCD's capacity to integrate for long periods (several hours) at low temperature. Noise levels as low as 1 $e^-$ appear achievable in the future.

(3) For wavelengths below about 100 Å (120 eV), CCDs provide photon-counting sensitivity that is equivalent to or better than that of photocathode/photomultiplier devices. With foreseeable reductions in CCD noise, such photon-counting performance could be extended to wavelengths as great as 1000 Å (12 eV).

(4) For wavelengths below about 10 Å (>1200 eV), some current CCDs can directly measure the photon energy with an accuracy of about 200 eV ($3\sigma$). Foreseeable improvements in noise performance and device structure could lead to accuracies of 50-eV at wavelengths as great as 100 Å (120 eV).

(5) Existing chips offer formats as great as 1024×1024 pixels and physical sizes as large as 18×18 mm, both of which are well in excess of that needed for current bandwidth limited broadcast applications, but are of substantial value to scientific users. Single devices of approximately three times this size are under development, and mosaicked arrays of CCDs can provide still greater focal plane coverage in ways that are impossible with vidicons.

Current scientific applications exploit these capabilities to only a very small degree.

CCD Structures

While the concept of charge coupling is well defined, it has been implemented by semiconductor manufacturers in a wide variety of ways. Two specific CCD structures which represent quite well the diversity of approaches will first be described. FIG. 1 illustrates schematically a cross section of one pixel in a three-phase CCD. The pixel consists of three overlying gates that induce a potential profile to gather and confine photon produced charge units ($e^-$). By clocking these gate potentials in a coordinated fashion, the charge units can be made to physically travel through the silicon into an adjacent pixel. The oxide and overlapping gates are thick enough to absorb short-wavelength photons and soft x-rays, so that the silicon substrate of the device is thinned to about 10 μm and illuminated from the back. See U.S. Pat. No. 4,245,158, and particularly column 5 for a discussion of this backside illumination technology for the three-phase CCD.

FIG. 2 illustrates schematically a cross section of one pixel in a virtual-phase CCD. In this device, a four-step potential profile within each pixel is achieved with ion implantation, and a single overlying gate clocks two of these potential steps to effect charge transfer. FIG. 2 shows schematic diagrams of the potential well configuration for the virtual-phase CCD. There are four sections in a pixel of interest from left to right. The first and second sections under a gate 10 are called the clock barrier and clocked well, respectively. The next section is called the virtual phase, which functions as a fixed barrier, and the last section is called the well because it has the lowest potential when the first two sections are up under control of the gate, i.e., when the negative control signal $\phi_1$ applied to the gate is low. During one phase, the gate is held at a high negative voltage, so that the first two sections are at a low potential for accumulation of electrons. Then for transfer of the charge from left to right, the negative gate voltage is lowered, thus raising the potential in the first two sections from the levels shown in dashed line to the levels shown in solid line. Since there is only one gate layer that overlies half of each pixel, it is possible to achieve significant short-wavelength response with frontside illumination. Other CCD structures include two-phase and four-phase designs. The virtual phase CCD is an extension of the two-phase CCD.

Virtual-Phase CCD Operation

It is known that the two-phase structure can be operated with a single clock that is driven above and below a fixed dc potential applied to the other phase, as shown in FIG. 3. For a virtual-phase CCD, however, the clock that is held as the dc potential in the two-phase CCD is fabricated into the silicon by implanting positive (+) ions, as noted above, and is biased at the substrate potential as shown in FIG. 4. The method by which this virtual-phase gate (indicated by the legend VP in FIG. 4) is operated is based on a phenomenon called "potential pinning" which will now be described.

For this discussion, it is assumed that an n-type buried channel is used. FIG. 5 is a typical potential profile for a buried-channel CCD. The gate voltage is indicated by $V_g$ and the surface and maximum potentials are indicated by the symbols $\phi_s$ and $\phi_m$, respectively. As the gate voltage $V_g$ is lowered to a more negative bias from $V_{g1}$ to $V_{g2}$, the surface potential $\phi_s$ is also lowered from $\phi_{s1}$ until it reaches the level where $\phi_{s2}=0$. At this point holes from the implanted regions flow across the surface, causing a channel inversion. The inversion forms an effective back bias, which "pins" the surface potential and prevents further lowering of $\phi_s$. The maximum potential $\phi_{m2}$ shown in FIG. 5 when $\phi_{s2}=0$ remains at a fixed positive value and allows photo-generated charge to collect or transfer under the layer of holes. The potential of the virtual-phase gate VP is thus created within the implanted virtual phase and well regions of the sensitive silicon, and remains fixed (pinned) during both a photon integration phase (dashed line in FIG. 4) and a transfer phase (solid line in FIG. 4). In that manner, a "pinned" potential virtual phase and well for the CCD replaces the dc gate potential used in the two-phase device described above with reference to FIG. 3.

By comparing FIG. 4 with FIG. 3, it is seen that the virtual-phase CCD achieves the same result with a single gate electrode per pixel that the two-phase CCD achieves with two electrodes per pixel. The two sections under the single gate electrode are active during the clocked phase of a transfer, and the other two sections are active as a channel stop during the other virtual phase used to integrate photon produced charge units in the clocked well (second of four sections in the virtual-phase CCD pixel). These sections are therefore called the "clocked phase" and the "virtual phase" sections of a pixel.

In fabrication, all four sections are first doped uniformly, forming an n-type buried channel 12. The potential well in the clocked phase (i.e., under the gate 10) is formed by a shallow n-type implant under the second section, indicated by + + + + in FIG. 2. A deep n-type implant is used to form the virtual barrier in the third section, and an even heavier deep n-type implant is used in the fourth section to form a potential well there. Because doping within this last section of the virtual phase is high, pinning this section would require a large negative gate bias. This can be avoided by a shallow p-type implant indicated by – – – – in FIG. 2. Such a p-type implant close to the surface of the silicon forces the surface potential to stay pinned for both negative and positive gate voltages. Thus, the gate electrode over the virtual phase (third and fourth sections) can actually be eliminated since it does not affect the potential profile in the silicon. Eliminating the gate improves quantum efficiency for frontside illumination in the blue region of the spectrum.

As will be described more fully hereinafter, the present invention utilizes backside illumination of any thinned CCD, whether it be four-phase, three-phase, two-phase or virtual-phase (single phase with a virtual second phase) in a manner which yields very high quantum efficiency for blue, ultraviolet, far ultraviolet and low energy x-ray wavelengths. However, the specific embodiment to be described herein by way of example, and not by way of limitation, utilizes the virtual-phase CCD because it allows storage of analog information, such as image data, via photon or ion impact to cause excess charge states representing analog information; stored data is retrieved by a combination of bias, charge integration and normal CCD readout.

In the case of such storage by ion implant, the storage is permanent, whereas in the case of storage by photon implant, the memory is reliable for only a limited number of readouts. This phenomenon of memory for multiple readout in the virtual-phase CCD is due to the ability to bias the control gate past channel inversion into what has been called th "excess charge region" where electrons flow freely into the oxide layer just under the gate electrode. There the electrons recombine with the radiation induced holes. This produces conductivity differences throughout the oxide layer over the array of pixels. An image thus produced by excess charge in the oxide layer, which may be called to oxide image, as distinct from the normal CCD image, may be read out many times by proper control of the gate bias. The oxide image, or analog information, may thus be stored and repeatedly retrieved, and in the case of the photon created oxide image, it may be erased.

SUMMARY OF THE INVENTION

In accordance with one aspect of the present invention, a method is provided to promote quantum efficiency of a CCD imaging sensor for blue, ultraviolet, far ultraviolet and low energy x-ray wavelengths, comprised of the steps of overthinning the back side to remove substrate material and some of the photosensitive semiconductor material, such as high purity $S_i$ or HgCdTe, and subjecting the back side of the overthinned detector to an intense flood of ultraviolet radiation prior to using the sensor for imaging. The ultraviolet flooding conditions the CCD detector for imaging with very high quantum efficiency for an extended period (months) of use if operated at a very low temperature, such as at nitrogen cooled temperature of $-130°$. A dead region (i.e. a depletion region) of potential wells about 6000 Å deep across the overthinned detector will exist just under a native $SiO_2$ film produced on the thinned detector as a result of the etching and cleaning procedures used for thinning. This $SiO_2$ film is full of electron traps (mainly defects at its outer surface). Photoemission of electrons from the valence band of the sensitive layer into the conduction band of the adjacent $SiO_2$ film on the back side cause the backside potential wells in the dead region to collapse. The dead region of potential wells thus becomes a UV flood-promoted accumulation layer of positive states to greatly increase the quantum efficiency of the CCD detector for either frontside or backside illumination.

In a buried channel CCD having an oxide layer on the front side over the sensitive semiconductor material, analog information may be stored as positive states in the oxide layer created by ionizing radiation in the form of an intense photon beam or an ion beam in a desired pattern which conveys the information. Such information may be read out by first clearing the CCD pixel wells using conventional readout techniques and then integrating the stored pattern by driving the gate bias potential of every CCD pixel to a potential more negative than is normally used for imaging and sufficient to reach an inversion level where excess charge current flows at sites of said positive states through the oxide layer into the pixel wells as leakage current in the stored pattern. Once excess charge current has been integrated in the pixel wells, the gate bias potential is returned to normal for conventional readout. In the case of ionizing radiation to produce a pattern of positive states on the oxide with implanted ions during fabrication, the memory is permanent in that it may be repeatedly read out many times over an extended period of time (months if the device is maintained at a cool temperature of about $-130°$ C.). The pattern of photon created positive states is less permanent, but it too can be read out a number of times, especially if operated at a cooled temperature (about −130° C.). If the bias potential is made more negative, beyond the excess charge breakpoint, this semipermanent information is erased. Once the stored information is gone, or no longer reliable, the CCD memory may be erased, and new information stored by a pattern of intense photon radiation.

The novel features of the invention are set forth with particularity in the appended claims. The invention will be best understood from the following description when read in conjunction with the drawings.

DESCRIPTION OF PREFERRED EMBODIMENTS

Before describing in detail preferred embodiments of the invention with reference to FIG. 6, additional background information will first be given on thinned backside illuminated CCD structures with reference to FIGS. 7(a), (b) and (c).

Figure 6:
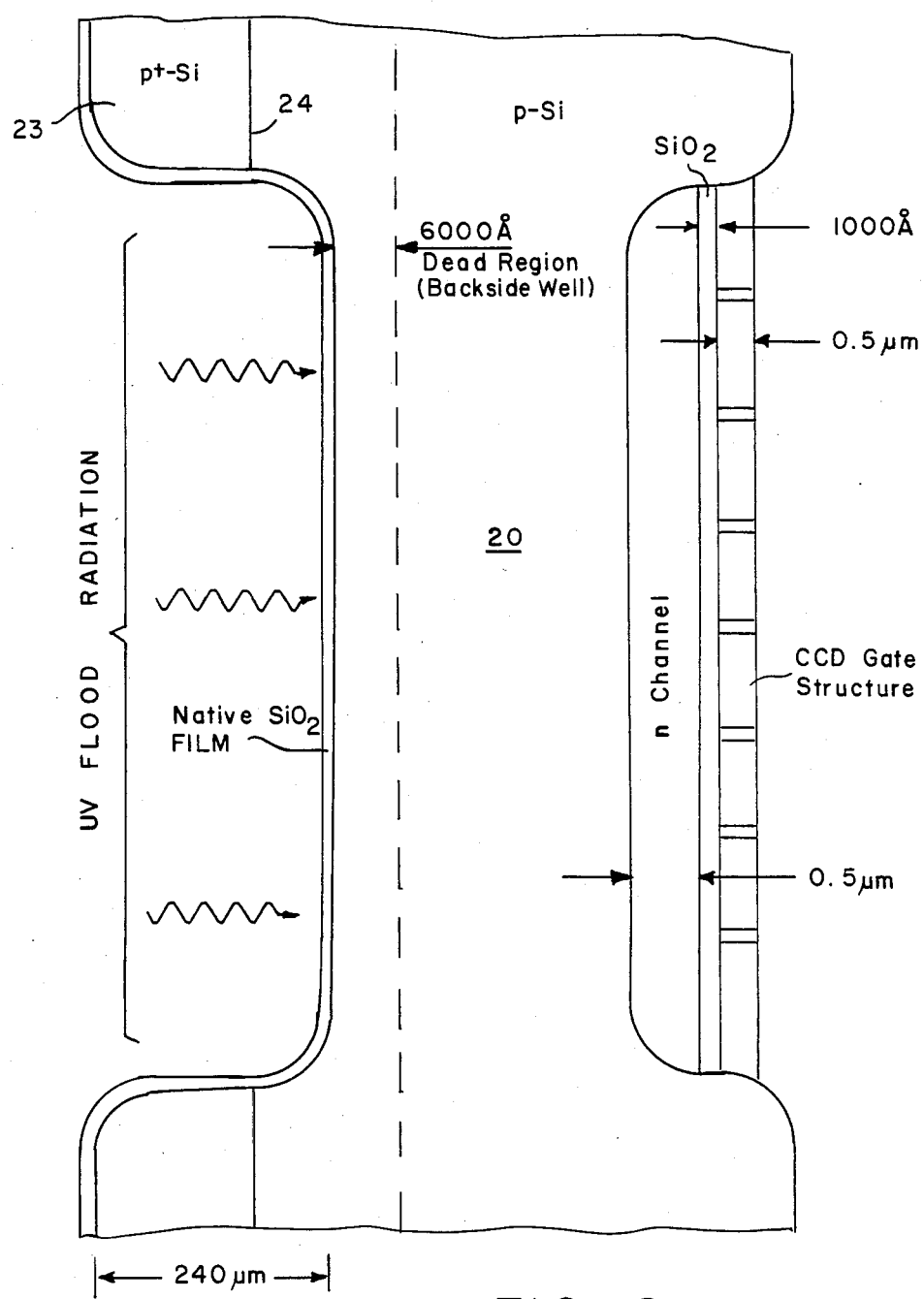
FIG. 6 illustrates schematically a buried channel CCD with an overthinned back side subjected to intense UV radiation flooding for much higher quantum efficiency in accordance with one aspect of this invention.

Referring to FIG. 6, the photosensitive volume of a backside illuminated CCD is a layer of high-purity silicon 20, bounded on one side by an oxide layer 21, and gate structure 22, and on the other side by a thinned region 20a etched through a thick, low lifetime p+ substrate 23 on which the device is fabricated. Typically, the CCD is built in an epitaxial layer on the highly doped substrate 23.

For photons with long absorption lengths (i.e., wavelengths less than 10 Å or greater than 7000 Å, see FIG. 7), the quantum efficiency (QE) depends largely on the thickness of the photosensitive volume 20. Quantum efficiency is the ratio of the number of electrons per pixel per second to the number of incident photons per pixel per second, which has units of electrons per incident photon. Intermediate wavelengths have relatively short absorption lengths in silicon and silicon dioxide and, throughout this spectral region, the QE depends largely on the transparency and reflective properties of the layers that bound the photosensitive volume. As one might expect, the QE performance of the CCD varies considerably depending on the CCD technology employed.

Figure 7A:
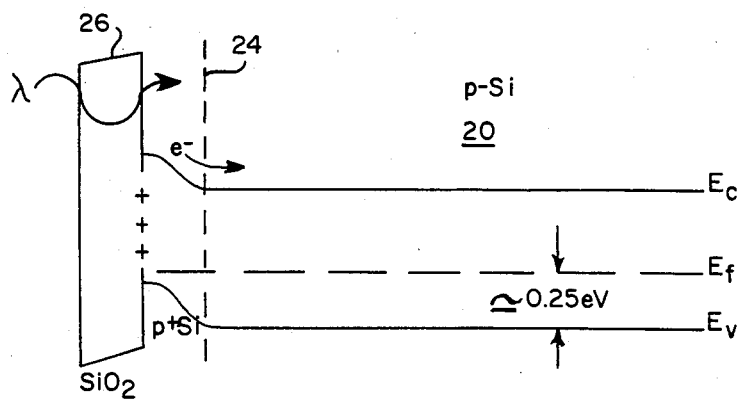
FIGS. 7(a), (b) and (c) illustrate the conduction and valence bands of a thinned, overthinned and under-thinned CCD.

For optimum QE, the substrate of a CCD is thinned to allow direct backside illumination of the sensitive layer 20, as illustrated schematically in FIG. 7(a). In the thinning process, an accumulation layer of p+ boron-doped silicon is intentionally left at the back surface to establish a field which aids the collection of charge. This results in an increase in QE in the 100- to 7000-Å range. The response throughout this range is a strong function of the surface condition and of the p+ boron accumulation profile. Ideally, thinning to the proximity of the p+−p boundary 24 between the sensitive epitaxial p layer and the substrate will result in optimum backside illumination characteristics by providing the proper electric field for directing signal charge to the potential well. There will always be an oxide film 26 formed on the surface of the thinned (etched) substrate by atmospheric oxidation of the etched surface following the process of removing etchant.

Figure 7B:
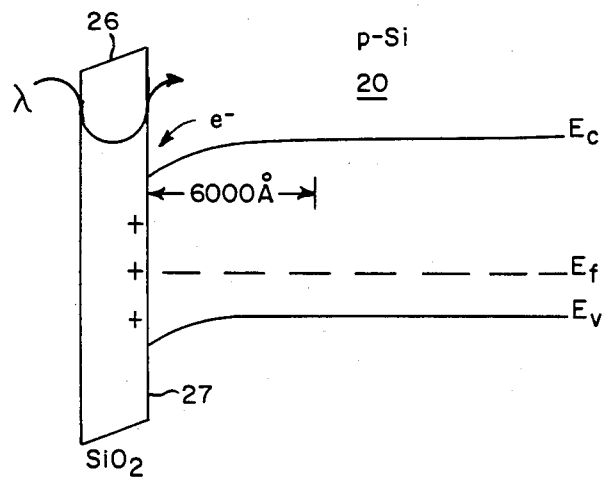
Figure 7C:
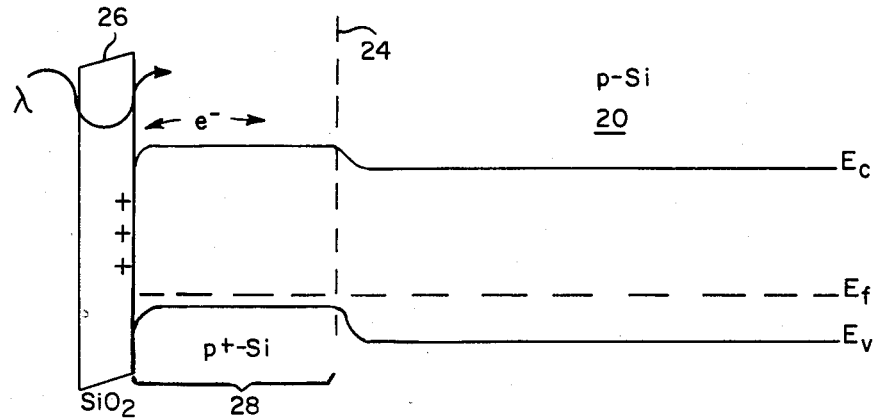

Overthinning into the sensitive epitaxial p layer 20, as shown in FIG. 7(b), will yield low responsivity in this wavelength range because the energy bands are bent downward by the positive trapped charge always found at the Si-SiO$_2$ interface 27. This downward band bending creates an unwanted backside potential well in a dead region, i.e., a depletion region of approximately 6000 Å in depth. Electrons produced by photons penetrating less than 6000 Å will collect in this backside well and be lost through recombination at the Si-SiO$_2$ interface 27. Conversely, an excessively thick layer 28 of p+ material shown in FIG. 7(c) will yield a low response due to recombination of short-lived minority carriers in the p+ material. Therefore, an optimum boron profile exists that most effectively directs carriers away from the back surface without permitting substantial carrier recombination. This optimum p+ layer is very difficult to achieve in practice due to nonuniform thinning of the chip. (Absolute thinning accuracies of better than 2000

Å are required to produce devices that behave uniformly.)

A simple method has been discovered to promote backside accumulation of a CCD structured as shown in FIG. 6, i.e., without the p+ boron layer 28 as a result of overthinning the back side, as shown in FIG. 7(b). It has been found that if the overthinned CCD is subjected to an intense flood of UV radiation, as indicated schematically in FIG. 6, a very high and uniform blue response can be achieved over the array. The mechanism proposed to explain this blue enhancement will now be discussed with reference to FIG. 8.

Figure 8:
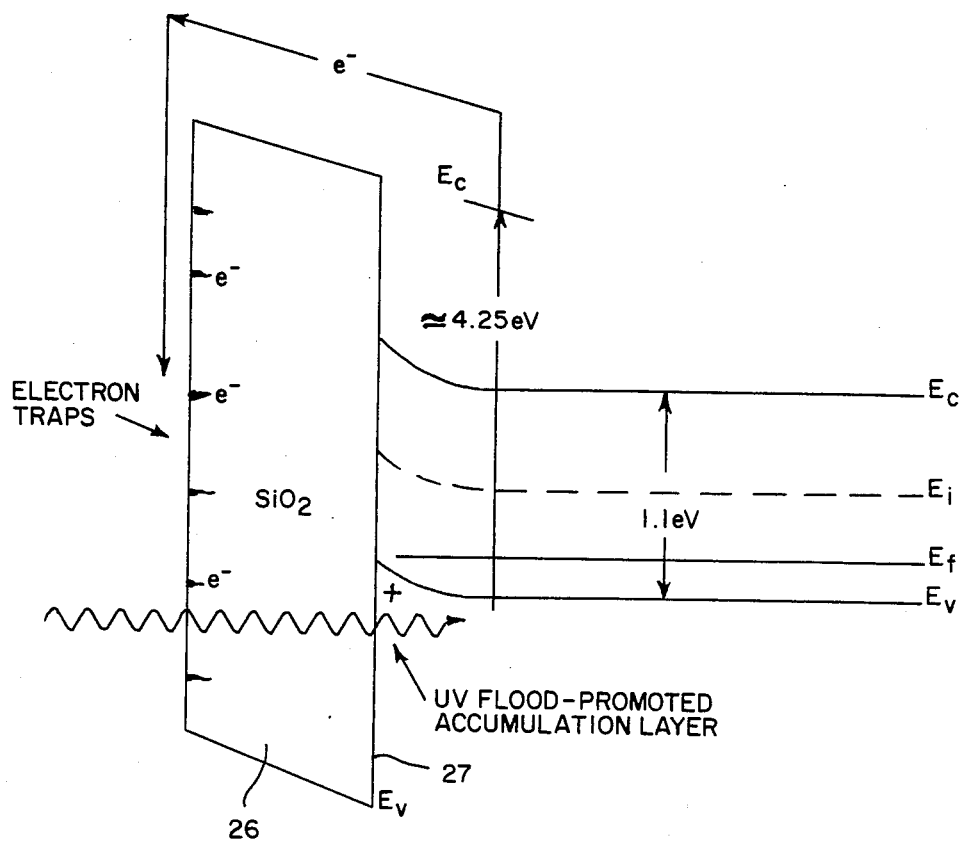
FIG. 8 illustrates the conduction and valence bands of an overthinned CCD subjected to intense UV flooding in accordance with one aspect of this invention.
Figure 9:
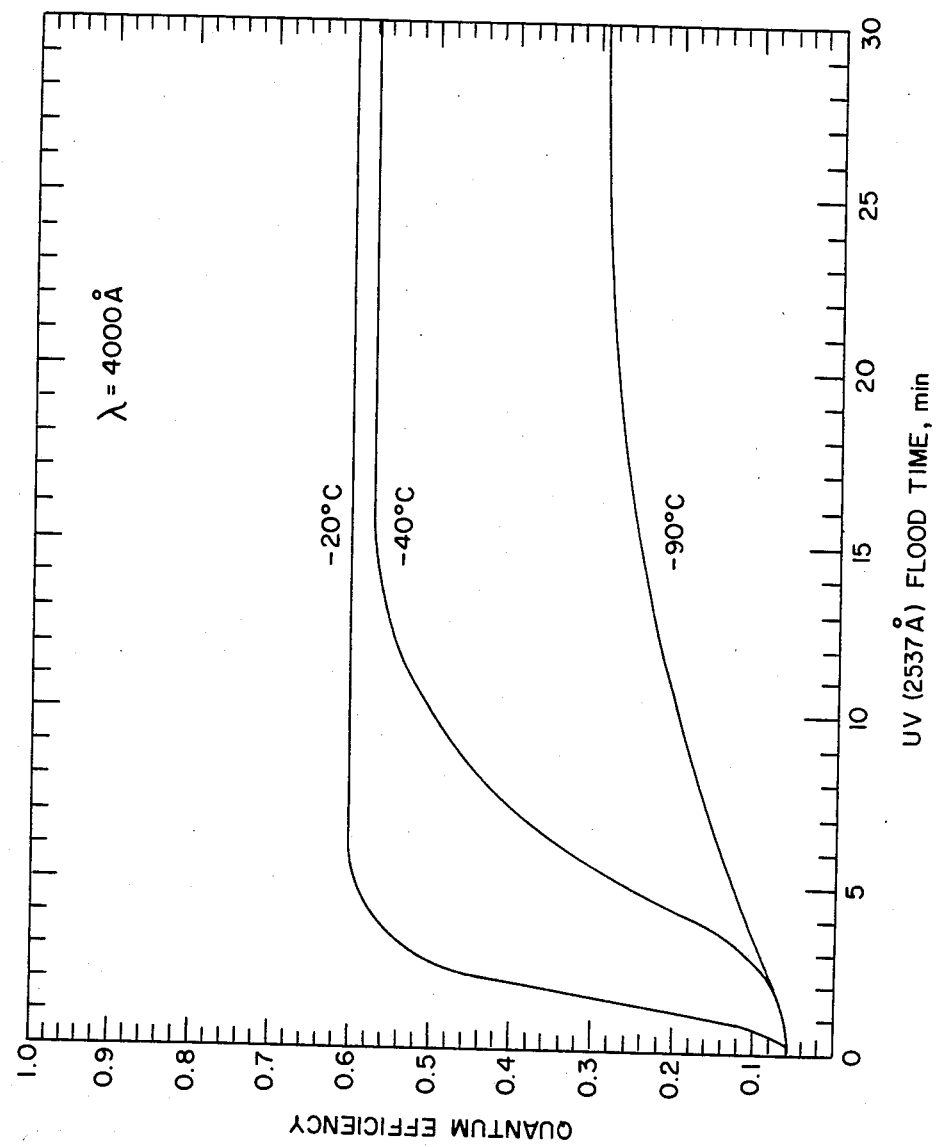
FIG. 9 is a plot of quantum efficiency as a function of UV flood times at different operating temperatures for a wavelength of 4000 Å.

Ultraviolet light causes photoemission of electrons from the valence band of the sensitive p epitaxial layer 20 into the conduction band of the adjacent $SiO_2$ film 26, causing the backside potential well shown in FIG. 7(b) to collapse, i.e., causing a UV flood-promoted accumulation layer as shown in FIG. 8, so that photoelectrons will proceed from the back side to the front side, as in the optimally thinned structure illustrated schematically in FIG. 7(a), instead of being lost in a well of an overthinned but not UV flooded structure illustrated schematically in FIG. 7(b). This process can be monitored by measuring the QE at 4000 Å as a function of UV flood time, as shown in FIG. 9. Since roughly 40% of 4000-Å light is lost due to reflection at the silicon surface of the device, FIG. 9 shows that this UV flooding technique achieves the full theoretical performance expected at this wavelength. The dramatic increase in QE for photon energies above 5 eV is due to multiple e-h pair generation per photon and a decrease in backside reflectivity.

Figure 10:
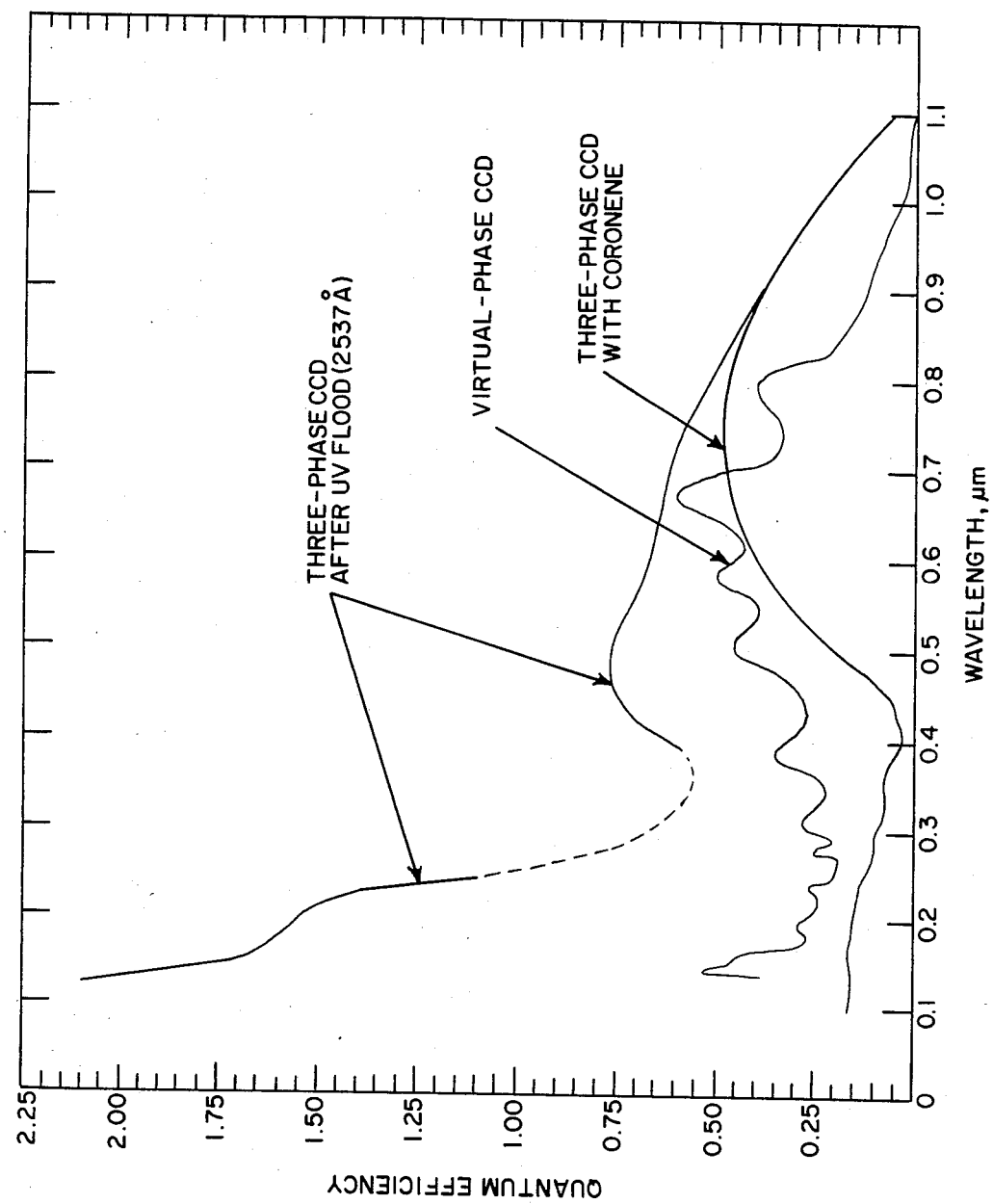
FIG. 10 compares three-phase CCD quantum efficiency at various wavelengths as a function of wavelength after UV flooding with a three-phase CCD with coronene coating and with a virtual-phase CCD.

The improvement in QE is even more dramatic for shorter wavelengths. FIG. 10 shows the QE for a three-phase CCD after backside UV illumination. For comparison, the QE of a three-phase CCD with coronene antireflector coating and a frontside-illuminated virtual-phase CCD are also presented. Here the backside-illuminated sensor, which yields a QE of greater than 200%, is far superior to the coronene-coated device. For example, the absorption length at Lyman α (1216 Å) is only 100 Å; hence, the UV-produced accumulation layer must be very thin to yield such high sensitivity. This finding is supported further by measurement of the quantum yield.

Figure 11:
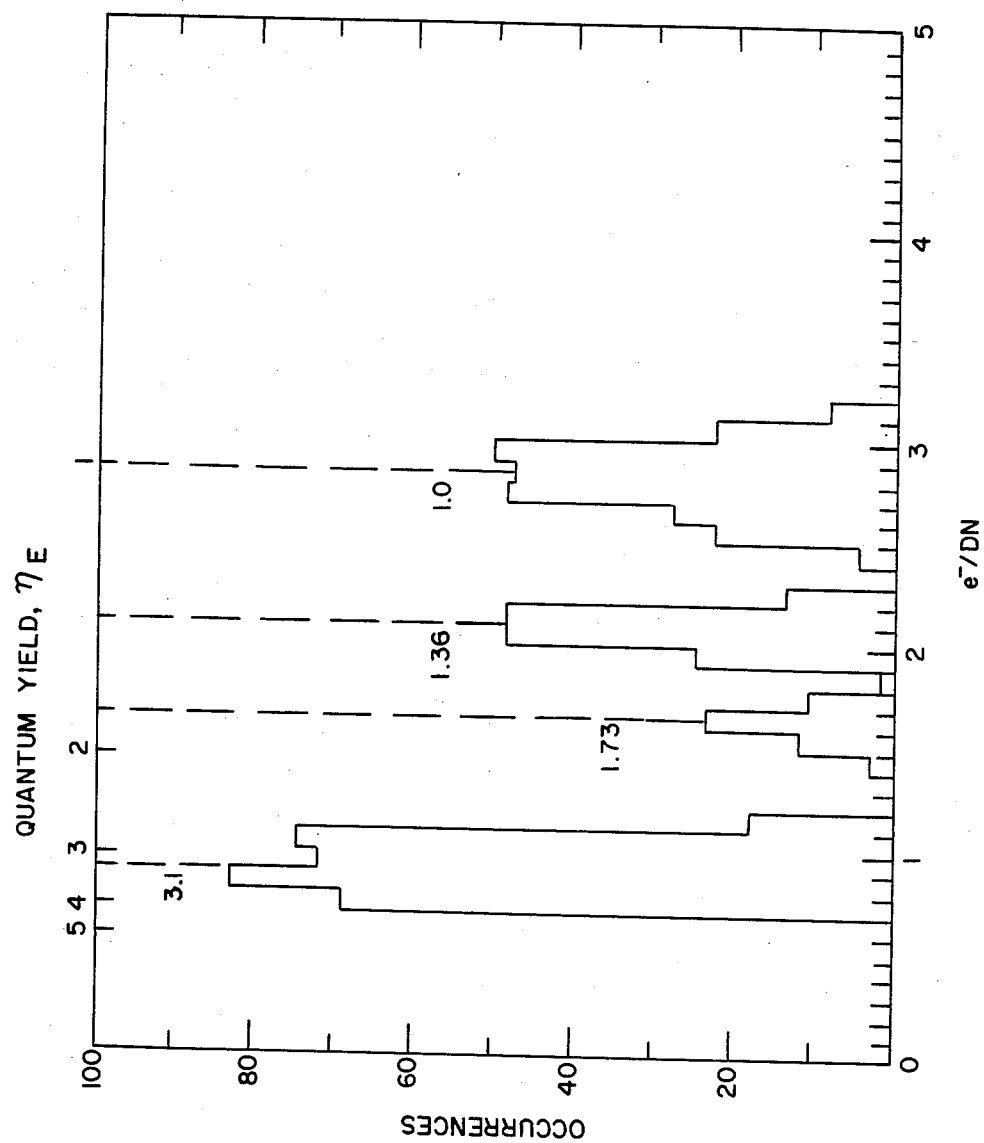
FIG. 11 shows the quantum yield for a 100×100 pixel subarea within a corner of a three-phase CCD after backside flooding with UV, where overthinning had produced high quantum efficiency (3.1), while not thinning to and through the interface of the substrate with the sensitive semiconductor material produces less quantum yield (1.0) to 1.73), depending upon the thickness of substrate material left.

FIG. 11 shows the quantum yield for a 100×100 pixel subarea within a corner of a three-phase CCD after backside charging with UV light flood. Several different yields are observed, which have been correlated to regions of different boron accumulation layer thicknesses caused by uneven thinning. A low quantum yield is measured where the device is thick and recombination is high due to the p+ layer 23. Areas thinned through the p+ layer show very uniform UV response and near-theoretical quantum yield (3 e−/photon). It can be concluded that each photon charge packet (3 e−) remains intact without recombination loss, implying that the backside flood-promoted accumulation layer 29 is indeed very thin (<50 Å).

As FIG. 8 shows, 4.25 eV of energy is required to cause photoemission of electrons from the valence band of silicon into the conduction band of $SiO_2$; therefore, backside illumination charging can only be achieved using wavelengths below 2915 Å. A light flood using 2537 Å (mercury lamp) has 0.7 eV more energy than is required for this purpose and works very well at room temperature. Charging at colder temperatures significantly increases the required UV flood time, and below −40° C. full charging cannot be achieved at 2537 Å (see FIG. 10). This effect has been attributed to a lack of additional thermal (kT) energy needed by the electrons to overcome the potential barrier of the $SiO_2$, which increases as the backside charges. It should be mentioned that corona discharge has been used successfully to provide full charging at cryogenic temperatures and offers advantages over UV flooding for some applications.

Figure 12:
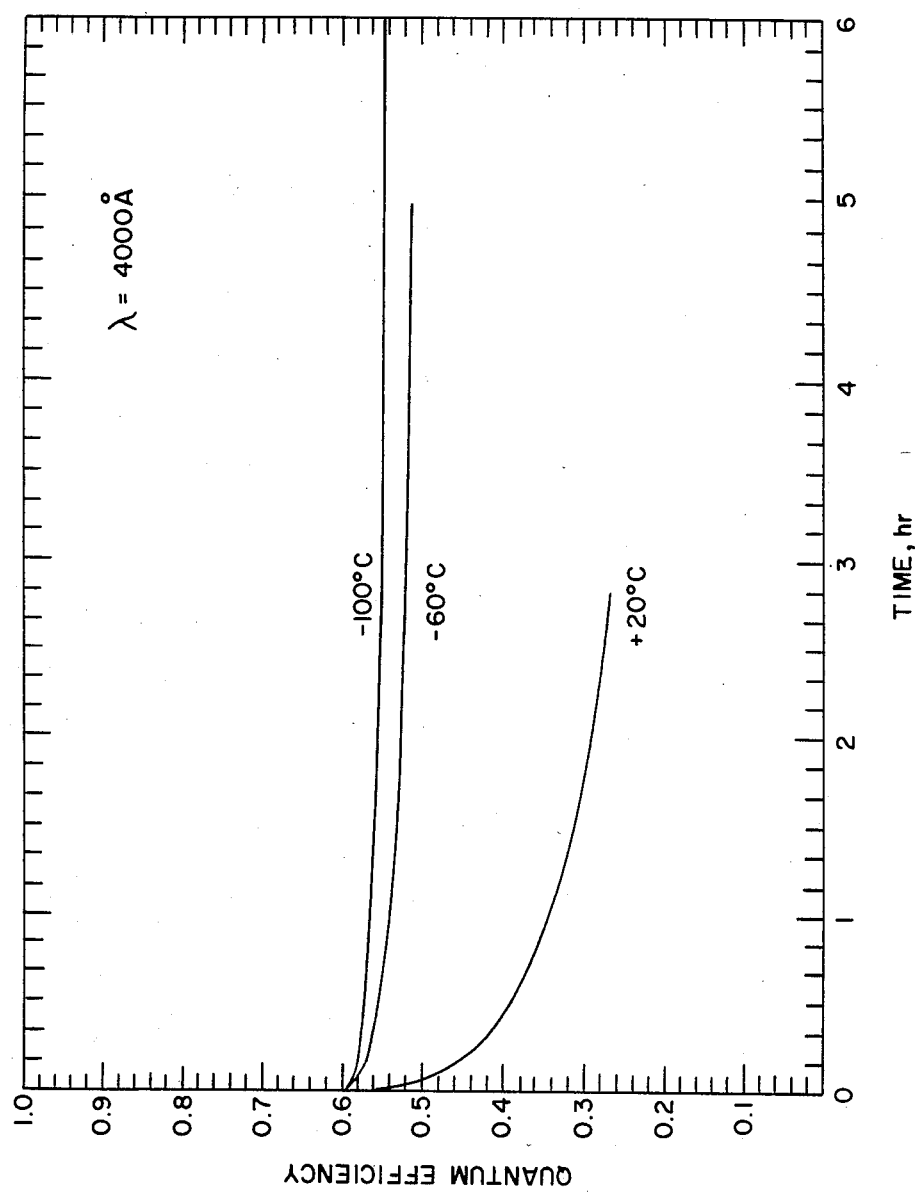
FIG. 12 is a plot of quantum efficiency for this technique of backside UV flooding as a function of operating time for temperatures of +20°, −60° and −100 C.

Stability of the very high QE produced by backside charging is chiefly dependent on temperature. FIG. 12 shows QE at 4000 Å as a function of operating time for temperatures of +20°, −60°, and −100° C. The characteristics shown are attributed to the discharge of electrons from $SiO_2$ traps at higher temperatures. Thus operation at the lower, such as 100° C., temperatures results in improved stability, and it has been shown that very long-term stability (weeks) can be achieved at a temperature of −130° C.

The backside discharge rate has been found to increase with humidity. Therefore, to assure stability of the very high QE, this problem can be eliminated by housing the CCD in a dry environment (e.g., $N_2$ or vaccum). It has also been found that discharge of the UV flood-promoted accumulation layer occurs when the device is exposed to light below 1800 Å, but enormous exposures (many times full well) are required for this discharge mechanism to have a noticeable effect.

Although this thinning and backside radiation flooding will improve the QE and uniformity of a UV, far UV and soft x-ray CCD of the two, three, four or virtual-phase type, a three-phase CCD is preferred because it is easier to fabricate in that it does not require ion implantation, though it does require a more complex pattern of metalization to provide for readout. However, the virtual-phase CCD structure has the ability of storing for repeated readout analog information, such as image data, in addition to forming and reading out image data that is temporarily stored in the usual manner. This is accomplished by frontside photon or ion impact on a virtual-phase CCD, causing "excess charge" representing analog data. Stored data is read out by a combination of bias control, charge integration and virtual-phase read out. In the case of ion impact, the data is stored indefinitely, and in the case of photon impact, the data is stored for readout a number of times. The excess charge may be discharged to erase the information stored by photon impact, and then recreated in a new pattern of information, thus providing a programmable read-only memory, as contrasted with the permanent read-only memory created by ion impact.

Virtual-Phase CCD Memory

Figure 1:
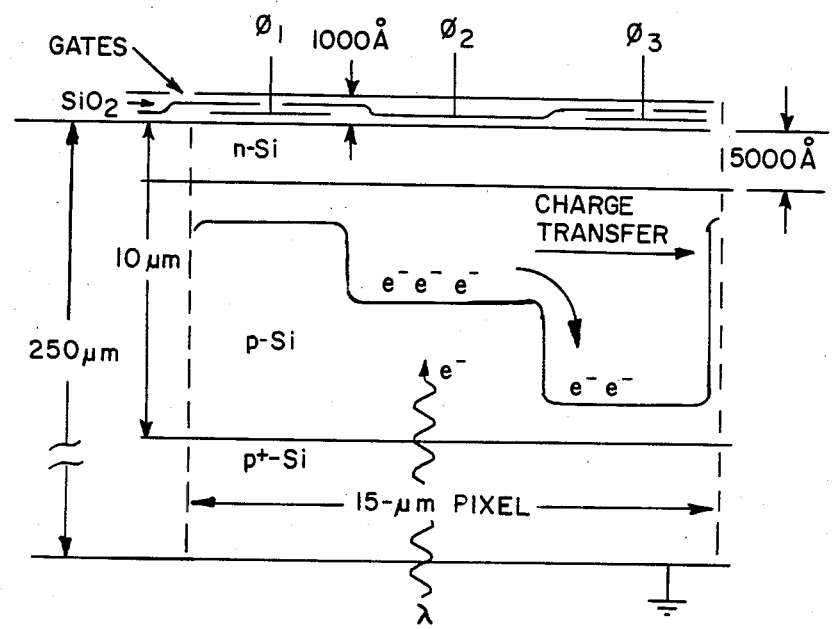
FIG. 1 illustrates schematically a prior-art pixel of a three-phase CCD.
Figure 2:
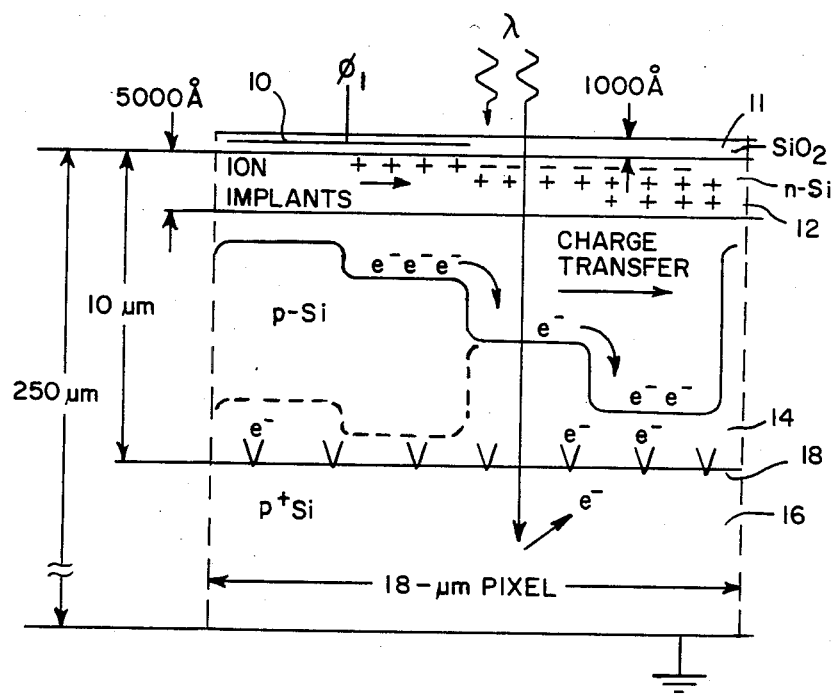
FIG. 2 illustrates schematically a prior-art pixel of a virtual-phase CCD.
Figure 3:
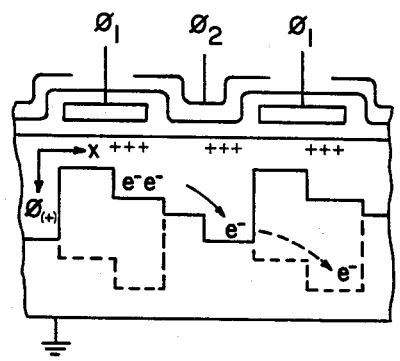
FIG. 3 illustrates schematically the operation of two pixels of a prior-art two-phase CCD.

This technique of providing a CCD memory (permanent or programmable) is based upon an "excess charge" phenomenon that has been discovered in the fabrication of a virtual-phase CCD, which requires ion implantation to form the virtual barrier and potential well of each cell, as described with reference to FIG. 2. The phenomenon results from positively charged ions created in the oxide 11 by excessive ion implantation while forming the virtual barriers and potential wells. This ionization of the $SiO_2$ film creates leakage currents which mix with the desired signal charge located within the active (photosensitive) regions of the CCD, thereby degrading the signal-to-noise ratio of the CCD sensor. Annealing the oxide decreases the oxide conductivity, thereby decreasing the leakage currents. This annealing is accomplished by biasing the control gate potential past channel inversion into what is called the "excess charge" region (see FIG. 13) where electrons flow freely into the oxide, recombining with the radiation-induced positive states in the oxide film. As a result, the conductivity of the oxide is decreased to its normal value.

Figure 4:
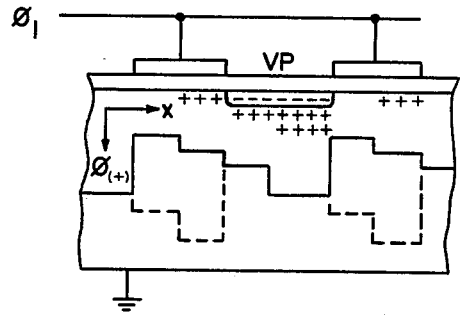
FIG. 4 illustrates schematically the operation of two pixels of a prior-art phase CCD.
Figure 5:
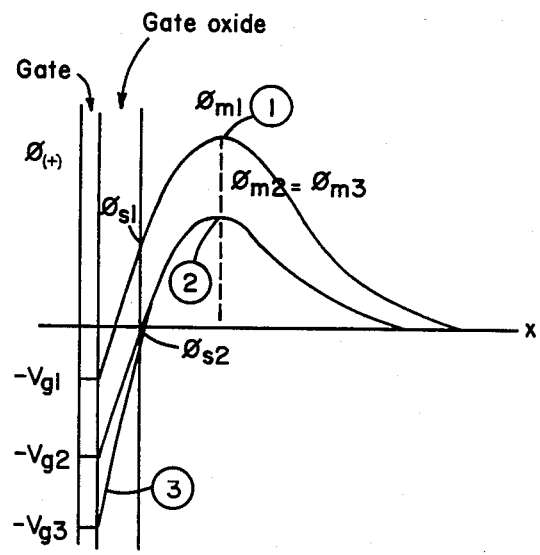
FIG. 5 illustrates typical potential profiles in a prior-art virtual-phase CCD.

Referring to FIGS. 4 and 5, which illustrate schematically a cross section of a pixel in a virtual-phase CCD and a typical potential profile, respectively, it should be recalled that during integration of charge units while a shutter is open, the gate bias potential is held at a level near the excess charge region, typically −14.5 V, in order for the potential profile to be along the solid line in FIG. 4. For transfer during readout, the gate bias potential is raised, typically from −14.5 V to −14 V in order for the potential profile to be along the dashed line shown in FIG. 4. Following readout the gate bias potential is again made negative at a level beyond the integration potential for standby, typically −17.5 V. The three active potential profiles are plotted as a function of distance from the Si-SiO₂ interface in FIG. 5 for the following gate bias potentials:

$V_{g1} = -12$ V (reference)
$V_{g2} = -14$ V (readout)
$V_{g3} = -14.5$ V (integration)

Figure 13:
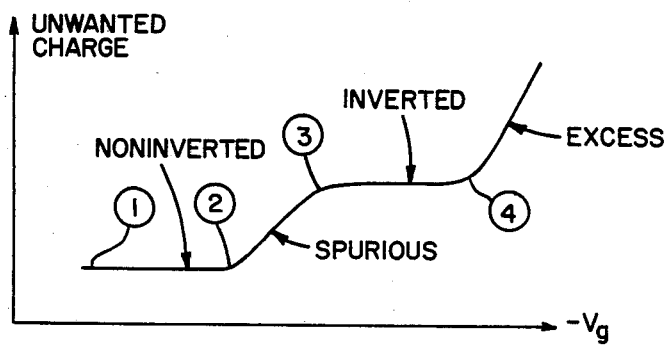
FIG. 13 is a plot of unwanted charge as a function of gate bias potential for a buried channel CCD, such as the virtual-phase CCD of FIG. 4.

The separate potential profiles are identified in FIG. 5 by the corresponding subscripts in a circle. FIG. 13 then shows the unwanted charge produced at those gate bias potentials. Each portion of the plot attributed to the four different bias potentials including the standby bias potential $V_{g4} = -17.5$, are then identified in FIG. 13 by the same subscript in a circle. From FIG. 13, it can be seen that an excess charge breakpoint occurs at $V_{g4}$, an erase/standbay voltage of typically −17.5 V, and spurious charge occurs between $V_{g2}$ and $V_{g3}$, the read out voltage $V_{g2}$ being typcially −14 V, one half volt more positive than the integration voltage $V_{g3}$ of −14.5 V.

These spurious and excess charge characteristics are caused by positive states in the oxide, either created by ion implantation or ionizing radiation, such as strong UV radiation. Either will release silicon dioxide leakage currents called "excess charge." This excess charge is released into the depletion region of the virtual-phase CCD where image signal charge is to residue, i.e., into the pixel wells. In accordance with one species of this invention, ionizing radiation can be used to store in the oxide of the device analog information in the form of a radiation produced positive state in the oxide. As will be described more fully hereinafter, the stored information is semipermanent. It can be read several times over an extended period. The period tends to be shorter as operating temperatures increase, but at −120° to −130° C., the storage time may be as long as a day, while at −20° C., the storage time may be only a few hours. In the case of positive states produced in the oxide by implanted ions, in accordance with a second species of the invention, the information stored is permanent. Consequently, by using unwanted excess charge to advantage, it is possible to provide a programmable (semipermanent) read-only memory, or a permanent read-only memory.

Semipermanent Image Storage and Readout

Figure 14:
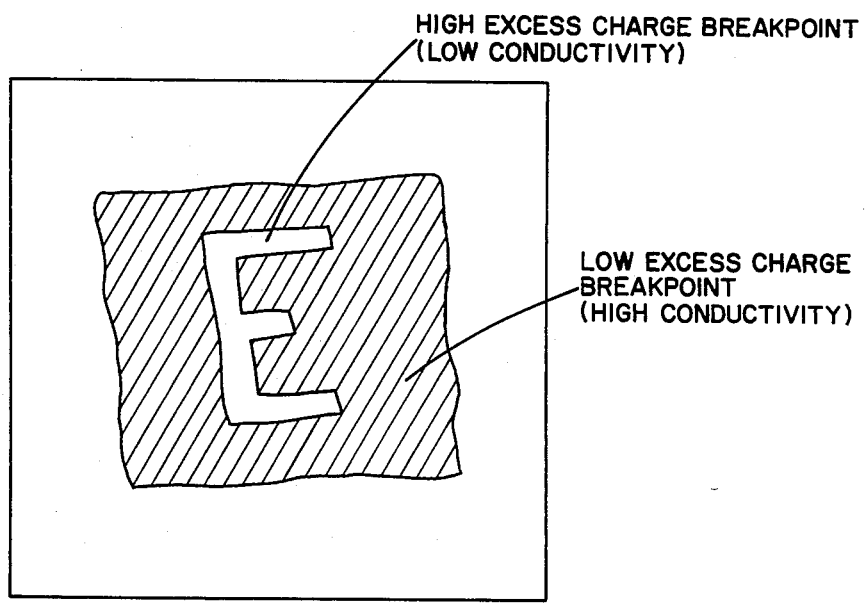
FIG. 14 illustrates a letter E stored in a buried channel CCD as a positive image (white or black), either as a permanent or a semipermanent memory using either ion implantation or intense photon radiation to create the respective permanent or semipermanent storage of the E in accordance with a second aspect of the present invention.

FIG. 14 illustrates a charge image of an E produced entirely within the silicon dioxide of a virtual-phase CCD through a mask. The area within the E was thus exposed to photon radiation which produced positive states in the oxide, thereby shifting the excess charge breakdown in an upward direction, i.e., to a less negative bias potential, causing an increase in silicon dioxide leakage currents. This may be done at any gate bias potential below $V_{g4}$, but preferably less negative than $V_{g2}$, or even at zero gate bias potential. To read out the photon-radiation image stored, the gate bias is first set more negative than the normal readout potential such as at −14.5 V, well below (less negative than) the breakpoint bias potential for the device, which in this example illustrated in FIG. 13 is found to be −17 V. Leakage current through the oxide in the area under the E will then flow into the CCD wells. After integrating this current for a brief period, the gate bias potential is returned to about −14 V, or some bias potential between −14 V and −12 V, where the excess charge conductivity of the oxide is reduced while the virtual-phase CCD is read out in the usual manner, as described with reference to FIGS. 4 and 5. The image read out will be a positive image of the E (white with black background).

The image thus stored is semipermanent, because each time the pixels are biased for integration, some electrons may migrate through the oxide region, annihilating the positive states produced at sites of defects in the oxide by the photon radiation. However, the image may otherwise be stored for a long time if operated at a low temperature (−120° to −140° C.). Repeated readout is possible if, during integration of the stored images in the pixel wells just prior to readout, the gate bias potential is not carried much beyond the point 3 in FIG. 13, where spurious conduction gives way to the desired inverted conduction.

To erase the stored image, the gate bias potential is carried past inversion into the excess charge region, i.e., beyond point 4 in FIG. 13, i.e., past −17 V in this example, to a more negative potential. This anneals the oxide of positively charges ions, which caused the leakage currents in selected areas (the E in the example of FIG. 14) by annihilation of the positive states. As a result of this annealing process, the conductivity of the oxide is decreased back to its normal value for conventional imaging.

If desired, analog information stored in the oxide layer may be read out while conventional image readout takes place. This is accomplished by limiting exposure of the CCD to below full well so as not to wash out the stored information, i.e., by operating the virtual-phase CCD at bias potentials below points 2 and 3 of FIG. 4. The result will be the stored information superimposed on the conventional image. Upon storing the analog information, and prior to reading out the analog information, or using the virtual-phase CCD for conventional imaging, the pixel wells are emptied by a conventional readout procedure.

Permanent Memory Image Storage and Readout

If a deliberate information pattern of excess ion implantation is produced in a buried channel CCD, such as the virtual-phase CCD at the time it is fabricated, and then subjected to normal annealing, the excess charge breakpoint of the pattern is shifted to a less negative potential due to migrating electrons annihilating some of the positive states of the implanted ions. Then operating with a new breakpoint thus established, the memory is operated as in the case of the semipermanent memory. First the gate bias potential is made more negative until the inversion region is reached, a potential at or just slightly more negative than point 3 in FIG. 13. Integration of leakage current through the oxide then takes place in the pixel well. After that the potential is reduced to about −14 V for normal readout.

The new breakpoint established after normal annealing may decrease slowly as electrons due to thermal agitation annihilate positive states, until the breakpoint reaches an equilibrium level. However, under dark conditions, the breakpoint level will remain stationary for long periods of time (weeks), especially if the device is operated at a low temperature ($-120°$ to $-140°$ C.). Consequently, the memory may be read out reliably many times over an extended period of time. Thereafter, the memory can be restored by again subjecting it to ion implantation in the desired pattern, or used as a temporary memory by radiating with intense photon radiation to replace the positive states of the annealed ions with positive states produced by photon radiation.

In summary, a permanent memory is created in a buried channel CCD by a localized increase in trapping sites in the oxide due to excess ion implantation in a desired pattern. That causes the excess charge image to form for readout under the proper integration bias (typically $-14.5$ V) for subsequent readout under normal biasing conditions. The same effect may be created on the device with an intense light source: photon stimulation empties existing trapping sites, thus creating positive states that are the equivalent of implanted ions which changes the excess charge breakpoint in the area of the intense photon radiation. The effect is identical to the permanent memory created by implanted ions, except that it is a temporary condition—repeated readout will eventually destroy the memory, and the device must be stored in dark, cold ($-40°$) conditions, and biased with low gate voltage. The virtual phase CCD may thus be used as an analog version of digital memory:

1. Permanent read-only memory (ROM) programmed during device fabrication by excess ion implantation, either by stopping the ion beam from time to time in a desired pattern, or modulating the intensity of the beam in the desired pattern.

2. Semipermanent read-only memory (PROM) user programmed by a pattern of intense photon radiation that may be easily erased to store a new pattern. In both, the gate bias voltage is made sufficiently negative (e.g., $-14.5$ V) to rech the inversion region of leakage current through the oxide. This may be referred to as the memory integration mode. Then the gate bias is made less negative (e.g., $-14$ V) in preparation for normal readout effected by making the gate bias voltage even less negative, as described with reference to FIGS. 4 and 5 for conventional read-out. For normal integration of an optical image, the gate bias potential is low (e.g., $-14$ V). Charge transfer for readout is accomplished by raising the gate bias potential (e.g., $+1$ V).

It should be noted that the applied gate voltage is distinct from the gate bias potential. The latter is the net field potential produced by the device states and the applied voltage, but generally the procedure for readout of the CCD pixels is achieved by alternately decreasing the applied negative voltage to zero or beyond to some small positive level, thus allowing the gate potential to increase to the solid line level in FIG. 2, and increase the applied negative voltage, thus driving the gate potential down to the dashed line level. Each time this sequence is repeated, the stored charges of the pixels are transferred one pixel position. For readout of the memory (permanent or semipermanent), it is simply necessary to increase the applied negative voltage, thus driving the gate potential down to the inversion level (e.g., $-14.5$ V). But first the virtual-phase CCD is read out to clear the pixels of any stored charge. Then, memory integration fills the pixel wells with stored charges according to the pattern stored in memory for readout in the conventional way. In other words, the information stored in the oxide must be first transformed into pixel charges and then read out. Otherwise, conventional imaging readout will take place, i.e., only conventional optical image charges will fill the pixel well for conventional readout. In either case, permanent or semipermanent memory, the stored information is erased by increasing the negative gate bias potential beyond inversion into the excess charge region. A semipermanent information pattern may thereafter be stored by decreasing the negative bias potential below the normal readout potential, as noted hereinbefore.

Although particular embodiments of the invention have been described and illustrated herein, it is recognized that modifications and variations may readily occur to those skilled in the art. Consequently, it is intended that the claims be interpreted to cover such modifications and variations.

What is claimed is:

1. A method for storing and reading out information in a buried channel charge-coupled-device imaging sensor having an oxide layer on the front side over an array of pixels in a layer of photosensitive semiconductor produced on a substrate material, and charge transfer gates for reading out image charges from wells of said array of pixels, comprising the steps of storing said analog information as positive states in said oxide layer created by ionization radiation in a desired pattern with conveys said information, and repeatedly reading out said information stored in said oxide layer by first clearing said charge-coupled-device pixel wells by using conventional charge transfer procedures for image readout from said charge-coupled-device, then driving the gate bias potential of every charge-coupled-device pixel well to a potential more negative than required for imaging and sufficient to reach an inversion level where excess charge current flows at sites of said positive states through the oxide layer into said pixel wells as leakage current in the stored pattern, and thereafter, having integrated excess charge current in said pixel wells, reading said analog information from said pixel wells by using conventional charge transfer procedures for image readout from said charge-coupled-device, thus clearing said pixel array for subsequent imaging in a conventional way.

2. A method as defined in claim 1 wherein said ionizing radiation is an ion beam for a permanent storage of said analog information.

3. A method as defined in claim 1 wherein said ionizing radiation is an intense photon beam for a semipermanent storage of said analog information.

4. A method as defined in claim 3 including the further step of driving said gate bias potential more negative than necessary for creating excess charge current to annihilate said positive states, thereby erasing said stored analog information whenever desired.

5. A charge-coupled-device imaging sensor with increased quantum efficiency for blue, ultraviolet, far ultraviolet and low energy x-ray wavelengths comprising
   a $p^+$-doped semiconductor substrate,
   a p-doped semiconductor layer sensitive to photoillumination,
   gates deposited on said semiconductor layer to define an array of pixels, and a region beneath said array of pixels thinned from the backside through said substrate to expose said p-doped photosensitive semiconductor material, and a native oxide film over said exposed p-doped photosensitive semiconductor material, leaving a region of unwanted wells about 6000 Å deep under said oxide film, and momentary illumination of said imaging sensor through said oxide film with intense ultraviolet photons penetrating into said region to produce photoemission of electrons from the valence band of said photosensitive semiconductor material to the conduction band of said oxide that migrate to electron traps in said oxide film, thereby causing a buildup of negative charge that promotes an accumulation of holes at the interface of said oxide film and said sensitive material, causing said unwanted wells in said region to collapse.

6. A charge-coupled-device imaging sensor as defined in claim 5 wherein said sensitive material is thinned to approximately 10 μm.

7. A charge-coupled-device imaging sensor as defined in claim 6 wherein said sensitive material is p-doped silicon.

8. A charge-coupled-device imaging sensor as defined in claim 7 wherein said sensitive material is p-doped HgCdTe.

9. A charge-coupled-device imaging sensor as defined in claim 7 having an oxide layer on the front side over said sensitive semiconductor material, and analog information stored in said oxide layer as positive states created by ionizing radiation.

10. A charge-coupled-device imaging sensor as defined in claim 9 wherein said ionizing radiation is comprised of an ion beam for a permanent storage of said analog information.

11. A charge-coupled-device imaging sensor as defined in claim 10 wherein said ionizing radiation is comprised of an intense photon beam for a semipermanent storage of said analog information.

* * * * *